United States Patent [19]

Misiano et al.

[11] Patent Number: 5,462,602
[45] Date of Patent: Oct. 31, 1995

[54] APPARATUS FOR CONTINUOUS REACTIVE METAL DEPOSITION IN VACUUM WITH WEB LOOPING OVER UPPER AND LOWER ROLLERS

[75] Inventors: Carlo Misiano; Enrico Simonetti, both of Rome, Italy

[73] Assignee: CE.TE.V. Centro Technologie Del Vuoto, Carsoll, Italy

[21] Appl. No.: 258,978

[22] Filed: Jun. 10, 1994

[30] Foreign Application Priority Data

Jun. 11, 1993 [IT] Italy ................... RM93A0385

[51] Int. Cl.$^6$ ........................................ C23C 16/54
[52] U.S. Cl. ................ 118/718; 118/724; 118/723 VE; 118/726
[58] Field of Search ............................. 118/718, 719, 118/720, 724, 726, 723 VE, 723 CB, 723 EB; 204/192.14, 298.24, 298.26; 427/251, 255.5

[56] References Cited

U.S. PATENT DOCUMENTS

| | | | |
|---|---|---|---|
| 2,665,228 | 1/1954 | Stauffer . | |
| 4,220,117 | 9/1980 | Shinohara | 118/718 |
| 4,416,217 | 11/1983 | Nakamura et al. | 118/696 |
| 4,454,836 | 6/1984 | Akashi et al. | 118/718 |
| 4,692,233 | 9/1987 | Casey | 204/298.24 |
| 4,864,967 | 9/1989 | Kleyer | 118/718 |

FOREIGN PATENT DOCUMENTS

| | | |
|---|---|---|
| 0328257 | 8/1989 | European Pat. Off. . |
| 0460966A2 | 12/1991 | European Pat. Off. . |
| 3046564A1 | 9/1981 | Germany . |
| 3738722A1 | 5/1989 | Germany . |

*Primary Examiner*—Terry J. Owens
*Attorney, Agent, or Firm*—Herbert Dubno

[57] ABSTRACT

Apparatus and method for coating a plastic web with dielectric coatings formed in-situ by the reaction of a reactive gas with deposited metal as the web passes over lower and upper arrays of rollers in a vacuum chamber. The lower rollers are in a lower-pressure zone at which metal is deposited onto the web by vaporization, and the upper rollers are in a higher-pressure zone where the reactive gas reacts with the deposited metal. The reactive gas can be excited by a magnetron. The rollers of one array can be lower than other rollers thereof and be larger than rollers of the other array such that curvature of the web as it passes around the larger rollers is minimized.

8 Claims, 2 Drawing Sheets ns the web and at another pressure. A plurality of sources of metal vapor can be provided in the second zone juxtaposed with respective portions of the path of the web and thus with the loops formed by the web.

APPARATUS FOR CONTINUOUS REACTIVE METAL DEPOSITION IN VACUUM WITH WEB LOOPING OVER UPPER AND LOWER ROLLERS

FIELD OF THE INVENTION

Our present invention relates to an apparatus for reactive metal deposition and, more particularly, for continuously operating vacuum chamber apparatus for the coating of plastic films with metal compounds formed by reaction with a coating metal. The invention is specifically directed to the coating of dielectric plastic films with metal oxides and other compounds formed by reaction of a coating metal with a reactive atmosphere.

BACKGROUND OF THE INVENTION

Recently it has become of increasing interest to provide plastic films which are coated with metal oxides and like metal compounds as wrapping for foodstuffs and other materials which require limited access of moisture or oxygen to the packaged product or as to which it is desirable to limit the permeability of the film to fluids from the packaged product. Such coatings are also of interest as optical coatings for changing or establishing the appearance of a web of plastic.

In the past the coating systems for such purposes have been relatively slow, even if a roll-to-roll arrangement was proposed. Generally the time-consuming nature of the process depended upon the fact that the metal was required to react in the reactive atmosphere before it reached the web of plastic film. Alternatively, systems in which the metal was deposited upon the film and then reacted with the reactive atmosphere could not provide adequate time for the reaction to complete while ensuring sufficient speeds of the web.

Typical of the films which attempts were made to coat with metal compounds in the manner described were polyethylene, polyethyleneterephthalate and polyphenyleneoxide. The coatings were metal oxides and were intended to provide barriers to oxygen and water-vapor transport. The products were transparent films and were used for food packaging, particularly for foods sensitive to oxygen and water vapor.

The deposition of the coating onto the film generally involved plasma vapor deposition, for example, crucible evaporation, electron gun evaporation and sputtering or chemical vapor deposition (CVD).

The most common metal compounds were the oxides and nitrides and various metals could be deposited. (See the commonly-owned copending application Ser. No. 08/025,514 dated 2 Mar. 1993 and Ser. No. 08/222,690 filed 4 Apr. 1994.)

All of these earlier systems required considerable time to allow the metal to react with the gaseous environment even where the latter was activated by ionization or some other excitation to permit reaction with the metal.

In plastic film coating utilizing continuous plants with conventional configurations, it has been found to be impossible to allow the requisite reaction of the coating metal with the reactive atmosphere before formation of the coating since, for practical reasons, the web must travel at a speed of meters per second. The problem is exacerbated by the fact that satisfactory coatings require thicknesses of hundreds of angstroms of the dielectric, i.e. the metal oxide or nitride. In many cases the metal deposition rate is too high to obtain complete reaction, especially where the reaction is carried out at a pressure below $10^{-3}$ torr.

OBJECTS OF THE INVENTION

It is, therefore, the principal object of the present invention to provide a coating apparatus which allows the web to travel at a high speed while nevertheless ensuring complete reaction of the metal in the formation of the coated metal compound.

Another object of the invention is to provide an apparatus which overcomes the drawbacks of the earlier systems described.

It is still another object of this invention to provide an improved method or process for the dielectric coating of plastic films, for use as optic films or food-packaging films with low oxidation and water permeability, which allows the films to be produced at high speed in an economical manner.

SUMMARY OF THE INVENTION

These objects are achieved in accordance with the present invention in an apparatus which comprises:
  means forming a vacuum chamber containing a reactive atmosphere;
  a plurality of spaced apart rollers in the chamber defining a path for the web through the chamber including at least one loop;
  a supply roll for feeding the web to the path;
  a take-up roll receiving the web from the path; and
  at least one source of metal vapor juxtaposed with only a portion of the path for depositing a coating of the metal on the web, the coating reacting in the reactive atmosphere over another portion of the path.

The method of the invention can comprise the steps of:
  (a) withdrawing a plastic film from a roll within a vacuum chamber;
  (b) passing the plastic film withdrawn from the roll around rollers of upper and lower arrays in substantially vertical loops extending from a lower zone to an upper zone in the chamber;
  (c) maintaining one of the zones at a higher pressure than the other of the zones with a reactive atmosphere supplied to the zones;
  (d) juxtaposing with the loops in the other of the zones respective sources of metal vaporizing onto the web, thereby depositing the metal in a coating on the web, the coating reacting in the one of the zones with the reactive atmosphere to form the metal compound; and
  (e) a takeup roll downstream of the array in the chamber for winding up a coated web of the plastic film.

In particular, complete reaction of the metal is permitted because the substrate or web is subjected to the deposition in brief periods in which loops of the path of the web are juxtaposed with the metal sources or targets from which the metal is coated onto the web, the web then passing over the balance of each loop through the reactive gas atmosphere in which the metal is reacted to produce the desired compound. In other words the period in which the substrate is subjected to oxidation is largely amplified by the provision of short metal depositions followed by a long travel time in the reactive environment.

According to a feature of the invention the chamber is subdivided into two zones including a first zone containing the source and at a one pressure and a second zone containing the other portion of the path and at a higher pressure, the rollers including a multiplicity of rollers in the second zone defining a plurality of loops of the web along the path.

The path can include a plurality of passes through the first zone in each of which the web is juxtaposed with a respective one of a plurality of the sources whereby the coating is deposited in a series of stages between which the coating passes through the reactive atmosphere for reaction of metal of the coating therewith.

Thus the pressure in the deposition zone is lower than the pressure maintained in the reaction zone favoring in the latter the reactive processes which are proportional to the partial pressure of the reactive gas while in the first, or low-pressure zone, an excessive pressure does not induce interactions with the depositing material causing loss of energy, deterioration of the compactness of the deposited coating and effecting its barrier properties.

The apparatus can comprise a vacuum chamber provided, as is usual, with the pressure-reduction pump, a system of rollers defining the path of the web and, preferably, in addition to the metal vaporization unit, a reactive gas source. The reactive gas can be excited or activated by a variety of methods, including UV, DC or RF discharge, microwave, ECR, ionic or plasma guns. A physical screen can be provided to subdivide the chamber into the zones which are at different pressures.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
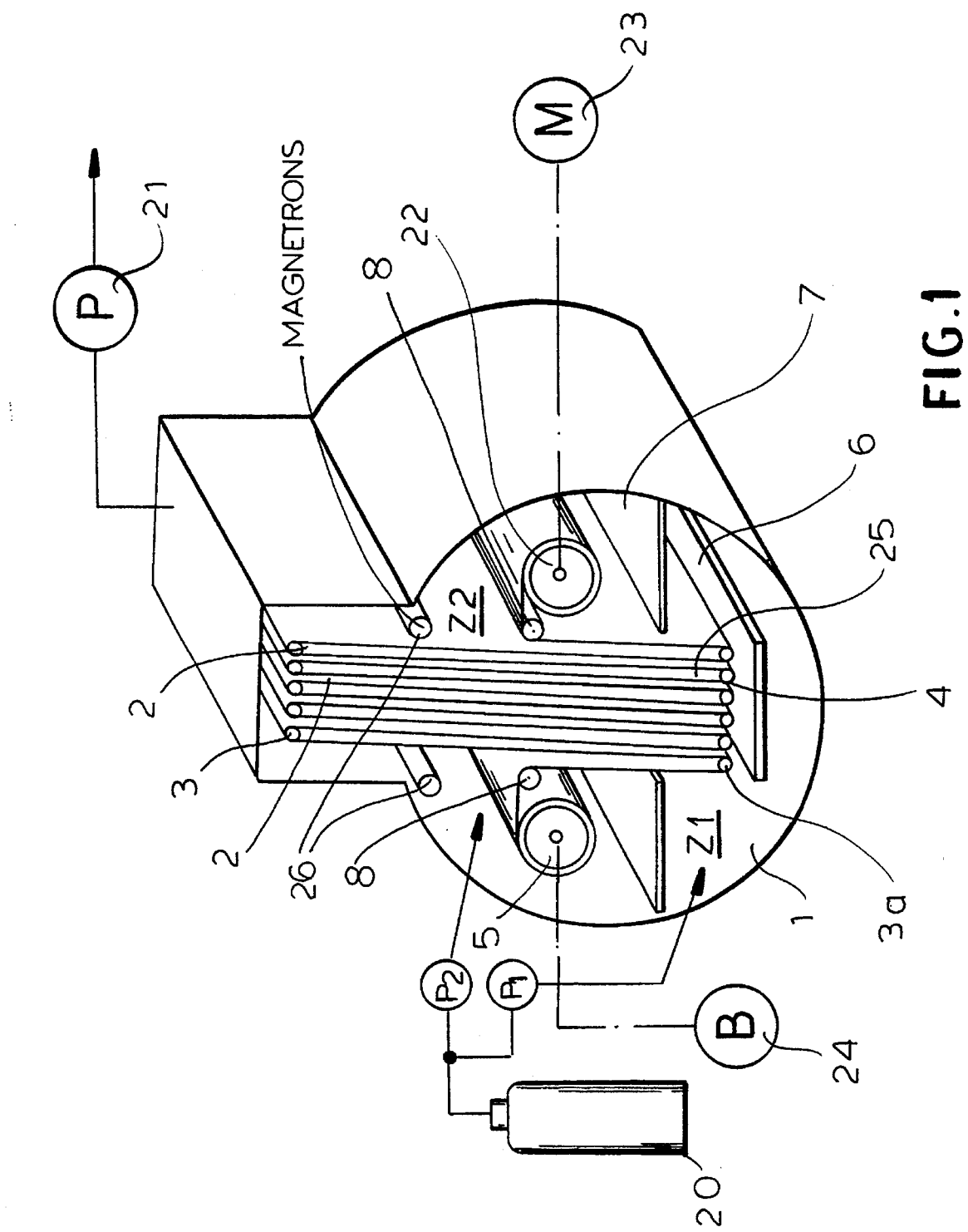
FIG. 1 is a perspective view, partly broken away of an apparatus according to the invention.

As can be seen from FIG. 1, the basic elements of an apparatus for the coating of webs of plastic film to provide dielectric coatings of a metal oxide or metal nitride, for example, include a vacuum chamber 1 within which the web of plastic film 2 is subjected to contact with a reactive gas under different pressures in zones Z1 and Z2, separated by a physical screen 7. The reactive gas, e.g. oxygen, may be supplied from a tank 20 via respective pressure controllers P1 and P2 to the respective zones Z1 and Z2. The reactive gas pressure in the zone Z1 is less than that in the zone Z2 so that deposition of the metal is facilitated in zone Z1 and the deposited metal is then reacted primarily in the zone Z2.

A vacuum pump 21 is connected to the chamber to evacuate it to a pressure less than $10^{-3}$ torr.

Within the chamber, the film is delivered by a supply roll 5 and taken up on a take-up roll 22. The take-up roll 22 is driven by a motor 23 and the supply roll 5 is retarded by a brake 24 so that the film is displaced on its path within the chamber at the desired speed.

In the low-pressure zone Z1 at least one source 6 of vaporizing metal is provided and is juxtaposed with limited regions 4 of the substrate surface exposed to the source so that within each pass into the low-pressure zone Z1, the film is coated with metal and then travels into the reaction zone Z2 where it is oxidized or, more generally reacted with the reactive gas to form the dielectric metal compound on the film.

Idler rolls 8 can be provided to guide the film within the chamber and the chamber is also equipped with upper and lower arrays of rollers 3 and 3a between which loops 25 of the web are formed. In operation, therefore, in each pass or loop, the film is coated with metal from the source 6 and as the metal coating passes into the reactive zone Z2, the metal is transformed into the coating compound. The coated web is wound up on the roll 22. Means can be provided for exciting the reactive gas mixture, e.g. the magnetrons 26. The means 26 may represent ion guns, other ionizing sources or means for generating ozone in the reactive gas mixture. Alternatively, the gas may be activated externally in the chamber and introduced in an activated state.

The source 6 may represent any sputtering source, including a source operated with an ion beam or thermal vaporizing source.

The number of transits of the film into the coating zone and back into the reaction zone depends upon the number of rollers 3, 3a. It will be apparent that with the apparatus of the invention, high web speeds can be used with relatively high coating thicknesses and vaporizing sources of comparatively low temperature.

Figure 2:
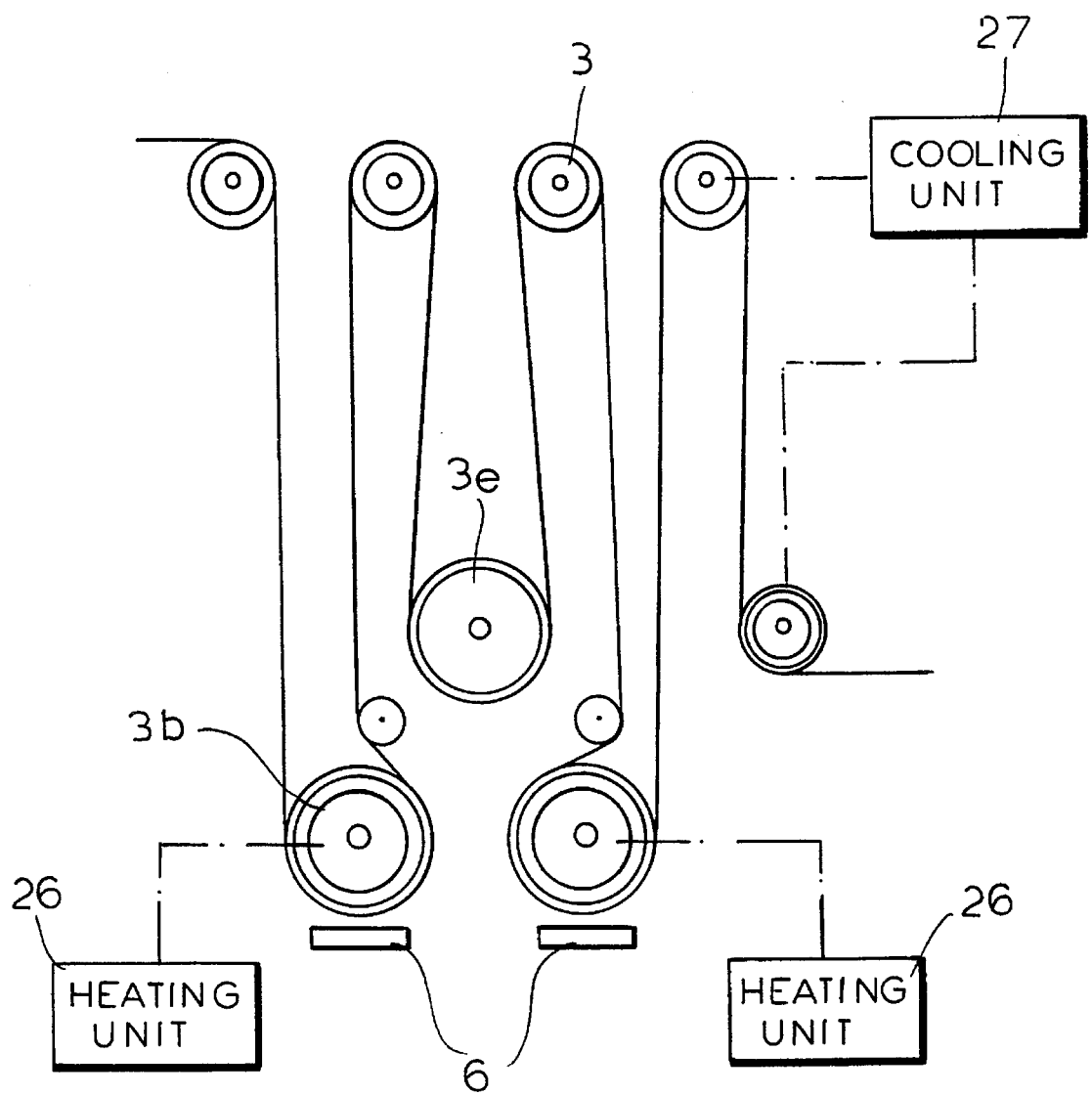
FIG. 2 is a diagrammatic elevational view of the roller arrays defining the path of the web in a further embodiment of the invention.

As can be seen from FIG. 2, the rollers of one array may be set higher or lower than other rollers thereof to allow rollers 3b and 3e, for example, to be of greater diameter than the rollers 3, such that curvature of the web as the web passes around rollers 3b and 3e is minimized. In this case, the rollers 3b may be provided proximal to the metal vapor source 6 while the roller 3e can be somewhat screened from the source.

As represented at 26 and 27 the rollers can be provided with heating or cooling units for circulating heating or cooling fluids through the rollers as desired.

Any of the plastic films described can be coated with metal oxides or nitrides, (e.g. aluminum oxide) by the method of the invention in thicknesses ranging from angstroms to microns in thickness at high rates.

We claim:

1. An apparatus for reactive metal deposition upon a web of a plastic film, comprising:

means for forming a vacuum chamber containing a reactive atmosphere;

a plurality of spaced apart rollers in said chamber defining a path for said web through said chamber;

a supply roll for feeding said web to said path;

a takeup roll for receiving said web from said path;

a plurality of sources of metal vapor juxtaposed with only a portion of said path for depositing a coating of said metal on said web, said coating reacting in said reactive atmosphere over another portion of said path, said chamber being subdivided into two zones including a first zone containing said plurality of sources and at one pressure and a second zone containing said other portion of said path and at a higher pressure, than said one pressure, said rollers including a multiplicity of rollers in said second zone defining a plurality of loops of said web along said path, said path including a plurality of passes through said first zone in each of which said web is juxtaposed with a respective one of said plurality of said sources whereby said coating is deposited in a series of stages between which said coating passes through said reactive atmosphere for reaction of metal of the coating therewith; and means for exciting said reactive atmosphere to promote reaction of the deposited metal therewith, said rollers including an upper array of rollers and a lower array of rollers, said web being looped between upper and lower rollers of said arrays, some of the rollers of one of said arrays being lower than other rollers of said one of said arrays and being larger than rollers of the other of said arrays such that curvature of said web as said web passes around the rollers of said one of said arrays is minimized.

2. The apparatus defined in claim 1, further comprising means for heating said rollers.

3. The apparatus defined in claim 1, further comprising means for cooling said rollers.

4. The apparatus defined in claim 1 wherein said rolls are located within said chamber.

5. An apparatus for reactive metal deposition upon a web of a plastic film, comprising:

means for forming a vacuum chamber containing a reactive atmosphere;

a plurality of spaced apart rollers in said chamber defining a path for said web through said chamber including at least one loop;

a supply roll for feeding said web to said path;

a takeup roll for receiving said web from said path; and at least one source of metal vapor juxtaposed with only a portion of said path for depositing a coating of said metal on said web, said coating reacting in said reactive atmosphere over another portion of said path, said rollers including an upper array of rollers and a lower array of rollers, said web being looped between upper and lower rollers of said arrays, some of the rollers of one of said arrays being lower than other rollers of said one of said arrays and being larger than rollers of the other of said arrays such that curvature of said web as said web passes around the rollers of said one of said arrays is minimized.

6. The apparatus defined in claim 5, further comprising means for heating said rollers.

7. The apparatus defined in claim 5, further comprising means for cooling said rollers.

8. The apparatus defined in claim 5, wherein said rolls are located within said chamber.

\* \* \* \* \*